United States Patent

[11] 3,588,551

[72] Inventors Stuart S. Perlman; Joseph H. McCusker, Princeton, N.J.
[21] Appl. No. 793,872
[22] Filed Jan. 24, 1969
[45] Patented June 28, 1971
[73] Assignee RCA Corporation

[54] ADAPTIVE RESONANT FILTER
17 Claims, 6 Drawing Figs.

[52] U.S. Cl. .......... 310/8.1, 310/8.6, 310/9.8, 330/5.5, 331/163
[51] Int. Cl. .......... H01v 7/00
[50] Field of Search .......... 310/8.1, 9.6, 9.7, 9.8; 330/5, 5.5, 12, 174, 60; 333/30, 72; 331/163

[56] References Cited

UNITED STATES PATENTS

| | | | |
|---|---|---|---|
| 2,695,357 | 11/1954 | Donley | 310/8.2X |
| 3,432,773 | 3/1969 | Land et al. | 310/9.6X |
| 3,174,122 | 3/1965 | Fowler et al. | 333/72 |
| 3,325,743 | 6/1967 | Blum | 333/30X |
| 3,414,779 | 12/1968 | Bohm | 330/5.5X |

*Primary Examiner*—Milton O. Hirshfield
*Assistant Examiner*—B. A. Reynolds
*Attorney*—Eugene M. Whitacre

ABSTRACT: An adaptive resonant filter includes two mechanically coupled piezoelectric elements with at least one element having ferroelectric properties. Input signals are applied to one element and output signals are derived from the other element. Voltage pulses are applied to the piezoferroelectric element to control the piezoelectric effect of the element and thereby control the level of the filter signal output. The piezoelectric elements can have their electrical contacts segmented to form multiple elements one of which can provide a feedback signal or voltage connected as part of an oscillator.

INVENTORS
STUART S. PERLMAN
JOSEPH H. McCUSKER
BY Eugene M. Whitacre
Attorney

INVENTORS
STUART S. PERLMAN
JOSEPH H. McCUSKER
BY
Eugene M. Whitacre
Attorney

INVENTORS
STUART S. PERLMAN
JOSEPH H. McCUSKER
BY
Eugene M. Whitacre
Attorney

ADAPTIVE RESONANT FILTER

The present invention pertains to an adaptive resonant filter and more particularly, to an adaptive resonant filter utilizing piezoelectric and piezoferroelectric materials.

Electronic control systems, particularly electronic control systems suitable to be used with television receivers, should have analog storage properties which are stable over sufficiently long periods of time. In addition, the system should have the capability of repeated resettability with a retention of the memory state should power to the electronic apparatus be interrupted.

An electric circuit embodying the present invention includes a member having piezoelectric properties and a first and a second terminal. The first terminal is adapted to be coupled to a source of electrical signals. A control means is coupled to one of the first and second terminals for selectively changing the piezoelectric properties of the member to control the signal level output from the second terminal when the first terminal is coupled to a source of electrical signals.

A complete understanding of the invention may be obtained from the following detailed description, when taken in conjunction with the accompanying drawings, in which.

Figure 1:
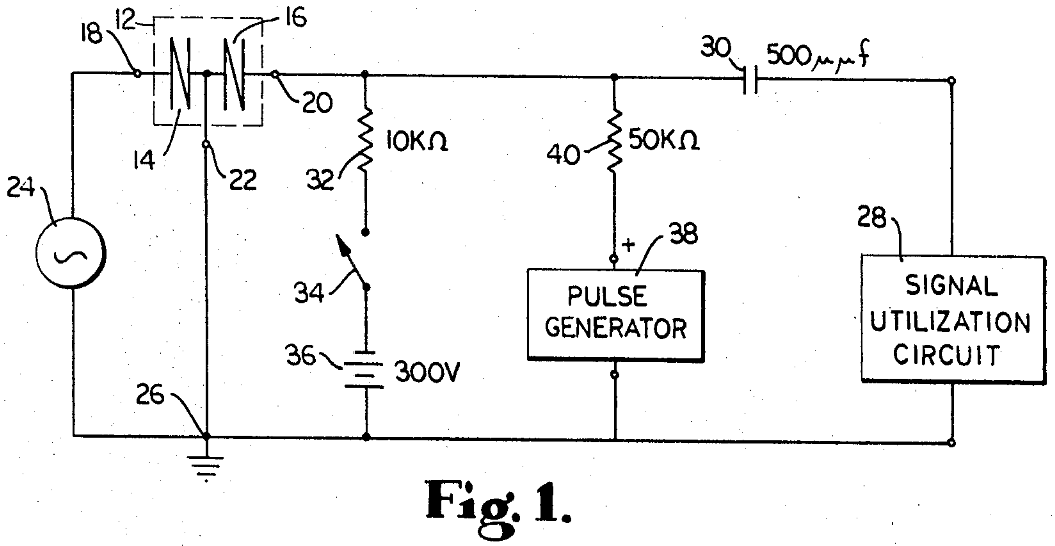
FIG. 1 is a schematic circuit diagram of a system utilizing a piezoferroelectric adaptive resonant filter and embodying the present invention.

Referring now to FIG. 1, an adaptive resonant member or filter 12 includes a first piezoelectric element 14 and a second piezoelectric element 16. The expression adaptive resonant filter is used herein to mean an electronic member whose gain $$\left(\frac{\text{open circuit output voltage}}{\text{signal input voltage}}\right)$$

can be reversibly adjusted or adapted between two extremes. The elements 14 and 16 in addition to having piezoelectric properties, have ferroelectric properties, although for the particular embodiment shown in FIG. 1 only piezoelectric element 16 need have ferroelectric properties. The elements 14 and 16 each provide a capacitance between their respective terminals 18 and 20 and a common terminal 22.

A signal generator 24 is connected between the terminals 18 and 22 to provide input signals to the piezoelectric element 14. The terminal 22 may be connected to a point of reference potential 26, shown as ground. Output signals from the adaptive resonant filter are obtained at the output terminal 20 and are coupled to a signal utilization circuit 28 by a coupling capacitor 30. The output signals are positively or negatively shifted in phase 90° from the input signals when the input signals frequency equals the natural resonant frequency of the filter.

Control means are coupled to the member for selectively changing the piezoelectric properties of the member. A reference level for the gain of the adaptive resonant filter 12 is established by means of a reset voltage that is applied across the filter terminals 20—22. Thus, the series combination of a resistor 32, a switch 34, and a battery 36 are connected between the filter terminals 20 and 22. As is explained more fully hereafter, to change or adapt the filter gain from the reference level, a pulse generator 38 is connected in series with a resistor 40 between the filter terminals 20—22. If desired, actuation of either or both the pulse generator and the reset voltage can be remotely controlled.

Figures 2, 3:
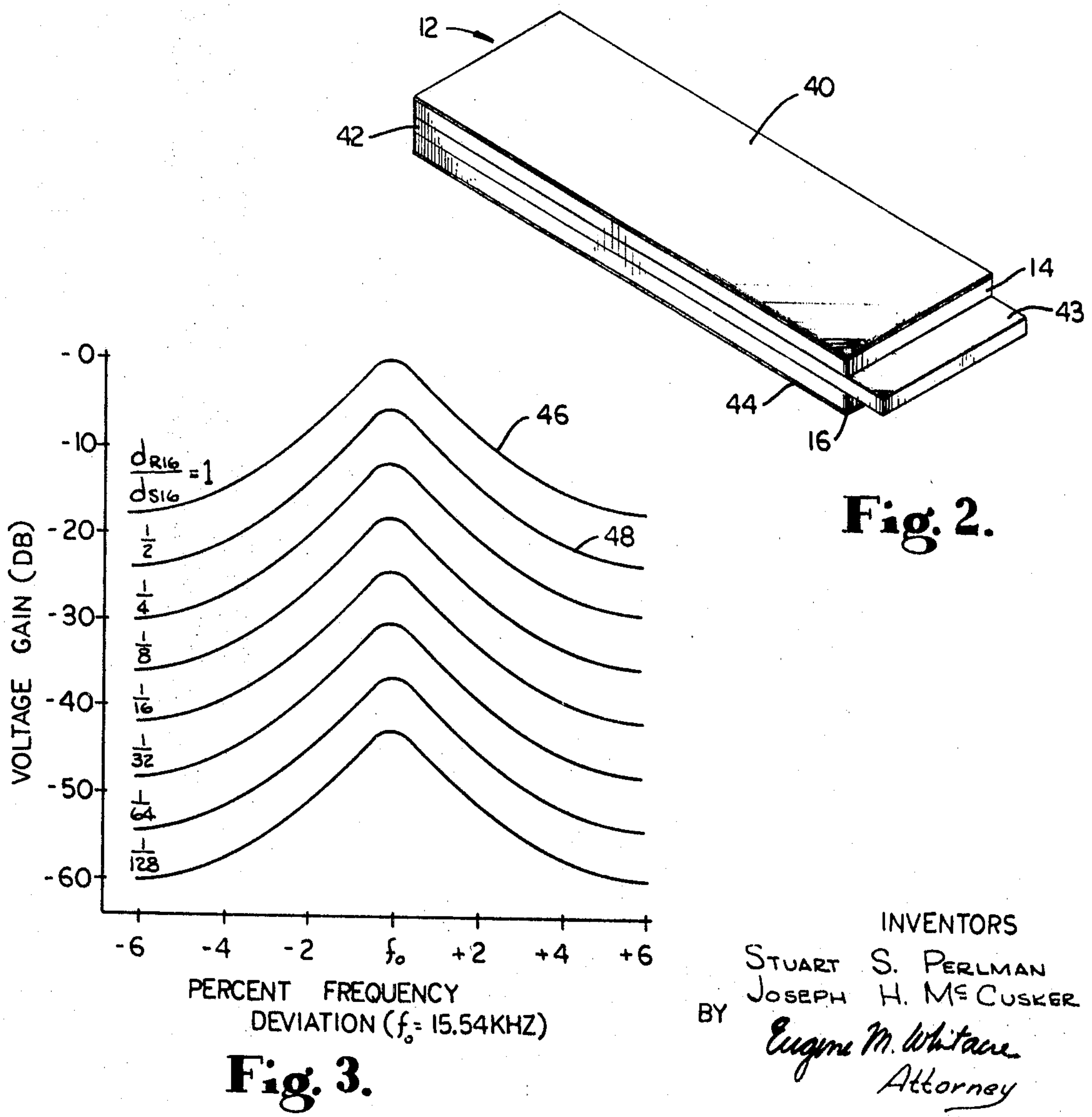
FIG. 2 is a perspective view of the adaptive resonant filter schematically shown in FIG. 1.
FIG. 3 is a graph of the transfer characteristic of the adaptive resonant filter shown in FIG. 2 for various levels of remanent piezoelectric coefficient.

Reference is now made to the filter structure shown in FIG. 2. The filter structure is in effect a beam sandwich formed of a metal contact 40, the piezoelectric element 14, a conductive brass center vane 42, the piezoelectric element 16, and a metal contact 44. The specific dimensions of the adaptive resonant filter 12 are as follows: width 0.15 centimeters; height 0.05 centimeters (including 0.016 centimeters brass center vane); piezoelectric element length 0.46 centimeters; and center vane length 0.50 centimeters. The elements 14 and 16 are a ceramic piezoferroelectric material. The particular material utilized is sold under the trade name PZT-5H and is manufactured by the Clevite Corporation, Bickford, Ohio. The material is of the family of donor doped lead zirconate-lead titanate which is treated in detail in an article entitled, "-Piezoelectric Properties of Polycrystalline Lead Titanate Zirconate Compositions" by D. A. Berlincourt, C. Cmolik and H. Jaffe, Proceedings of the IRE, Volume 48, Number 2, Feb. 1960.

The terminals 18 and 20 are electrically connected to the metal contacts 40 and 44, respectively. The common terminal 22 is electrically connected to the conductive brass center vane 42. As is readily apparent, the metal contact 40 and the center vane 42 form a capacitor with the piezoelectric element 14 serving as the dielectric. In a like manner, the metal contact 44 and the center vane 42 form a second capacitor with the piezoelectric element 16 the dielectric.

The filter structure 12 may be mounted in cantilever fashion at one end by submerging the center vane extension end 43 into a pool of epoxy adhesive which is set on top of a transistor header, with the lead wires attached to the submerged end of the beam. The center vane extension 43 is provided to facilitate attachment of the common terminal 22.

The resonant frequency of the filter 12 is a function of the piezoferroelectric material utilized, the geometry of the filter structure, the mounting technique and the mode of mechanical vibration which are all a matter of choice. With the particular mounting and the beam dimensions indicated above, the filter structure is mechanically resonant in a fundamental flexural (transverse) mode of approximately 16 kHz. Other resonant modes are possible, as for example, longitudinal, torsional, or shear.

In operation of the circuit shown in FIG. 1, the alternating voltage from the source of electrical signals 24 establishes alternating stresses in the element 14. These alternating stresses are mechanically coupled through the center vane 42 to the piezoelectric element 16. The alternating mechanical stresses in the piezoelectric element 16 cause a voltage to develop between the metal contact 44 and the center vane 42.

The voltage gain, the ratio of the open circuit output voltage to the input voltage, depends on the magnitude of the piezoelectric effect of the specific material utilized for the elements 14 and 16 as well as the efficiency of their mechanical coupling. In addition, however, the piezoelectric coefficient, a measure of the level of the piezoelectric effect, is directly proportional to the ferroelectric effect in piezoferroelectric materials. Hence, the voltage gain is dependent upon the orientation of the ferroelectric domains in elements 14 and 16. A remanent piezoelectric coefficient can therefore be defined such that $d_R/d_S=P_R/P_S$ where $P_R$ and $d_R$ are the magnitude of the remanent value of the piezoelectric coefficient and the polarization field, respectively, while $d_S$ and $P_S$ are the saturation values. As used herein, the remanent value of the piezoelectric coefficient and the remanent value of the polarization field are the values that obtain after pulse generator 38 applies an adapting pulse to the filter 12. Similarly, the saturation value of the piezoelectric coefficient and the polarization field are the values that obtain after the switch 34 has been momentarily closed to apply a reset pulse to the filter 12.

When defined as above, the remanent value $d_R$ of the piezoelectric coefficient and the remanent value $P_R$ of the polarization field are greater than their negative saturation values and less than their positive saturation values ($-d_S \leq d_R \leq +d_S$ and $-P_S$ $P_R$ $+P_S$). The voltage gain $G_o$ of the filter 12 when energized at its mechanical resonant or natural frequency, can be expressed as $$G_o = G_s \left(\frac{d_{R14}}{d_{S14}}\right)\left(\frac{d_{R16}}{d_{S16}}\right)$$

or $$G_o = G_s \left(\frac{d_{R14}}{d_{S14}}\right)\left(\frac{P_{R16}}{P_{S16}}\right)$$

$G_s$ is the maximum resonant gain with a phase angle of the output signal with respect to the input signal of −90° when the piezoelectric element 14 and 16 are displaying their maximum piezoelectric effects which correspond to positive saturation piezoelectric coefficients.

The adaption or adjustment of the piezoelectric level or coefficient in the adaptive resonant filter 12, and thus the filter gain, is achieved by selectively changing the magnitude and polarity of the remanent polarization field associated with the ferroelectric properties of the filter material utilized for the element 16. This, however, can also be achieved by adapting the magnitude and polarity of the remanent polarization field associated with both piezoelectric element 14 and 16. Maximum positive or negative remanent polarization exists when the ferroelectric domains over the entire area of the piezoelectric elements are aligned in the same direction. However, the piezoferroelectric element 16 of the filter can be partially adapted or changed by the pulse generator 38 to an intermediate value of remanent polarization. This corresponds to a condition where the sum of the positively oriented domains and the sum of the negatively oriented domains add up to a value which differs from either the positive or negative saturation values. The sum represents the amount of remanent polarization.

In the design of an electronic control system, of particular importance is the electrical stability of the voltage gain over short and long periods of time. For the filter structure shown in FIG. 2, the voltage setting was found to be stable to about ±1 percent of the maximum reset value for short periods of time (milliseconds) and for long periods of time (days). This stability was retained after the voltage gain was established under both the condition where the signal generator 24 continually energized the adaptive resonant filter 12 and the condition where the signal generator 24 was disconnected and subsequently reconnected to again energize the adaptive filter with input signals. Moreover, the gain settings for the adaptive resonant filter are substantially reproducible by repeating the same or an equivalent sequence of adapting pulses from the pulse generator 38.

The adaption or change of the voltage gain for the adaptive resonent filter 12 is dependent on the magnitude and duration of the switching voltage applied to the piezoferroelectric element 16. To prevent the voltage impressed on the capacitance of the element 16 from causing a continuous change in the filter voltage gain, a discharge path is provided through the resistor 40 and the internal resistance of the pulse generator 38. The pulse generator 38 can be selected to develop pulses that range over a wide variety of pulse height, pulse shape and pulse duration to achieve the desired adaption of the voltage gain each time a pulse is applied to the element 16. For adaption of the filter 12, the application of a rectangular pulse of voltage from the generator 38 ranging between +100 and +300 volts will adapt the gain of the filter 12 to any intermediate value. The range of +100 to +300 volts permits the adaptive resonant filter 12 to be changed from a maximum to a minimum voltage gain within a switching time of approximately $10^3$ to $10^1$ 4 seconds as determined by the pulse amplitude. It should be noted that the switching time is determined by the electric field (voltage/centimeter) applied across the element 16. The gain of the adaptive resonant filter 12 is relatively independent of the input signal amplitude from approximately 1 millivolt to about 1 volt r.m.s. and usually has a dynamic range of about 50 db. Naturally, there is a slight insertion loss.

Reference is now made to FIG. 3 which is a graph of the transfer characteristic or voltage gain of the adaptive resonant filter 12, expressed in terms of decibels, as a function of the percentage deviation of the source of electrical signals from the filter's mechanical resonant frequency for various levels of remanent piezoelectric coefficient. Curve 46 represents a condition where the piezoelectric elements 14 and 16 are set to their maximum value of remanent polarization, or put another way, the remanent piezoelectric coefficient for each of the elements 14 and 16 is equal to its saturation value ($d_{R14}/d_{S14}=1$ and $d_{R16}/d_{S16}=1$). When energized at its resonant frequency of 15.54 kHz., the filter's voltage gain is 0 db. By adapting the element 16 with a series of voltage pulses to change the remanent polarization field sufficient to reduce the remanent piezoelectric coefficient of $d_{R16}/d_{S16}$ to one-half, the gain $G_0$ decreases 6 decibels as is shown in curve 48. The successive curves each represent a further decrease of one-half in the remanent piezoelectric coefficient and a decrease of 6 decibels from the preceding curve.

It will be noted that the transfer characteristic of the adaptive resonant filter 12 is similar to that of a parallel resonant tuned circuit. The adaption by changing the level of the remanent polarization in the element 16 results in a displacement of the transfer characteristic but does not cause any significant deviation in the resonant frequency of the filter. In general, the transfer characteristic of adaptive resonant filters have been found to display an electronic Q ($f_o$/BW) of approximately 40 to 100 at resonant frequencies ranging from 100 Hz. to 10 MHz. The losses associated with the elements 14 and 16 and the mechanical mounting strongly affect the shape of the transfer characteristic of the filter 12 and hence the electronic Q. However, because the losses are essentially unaffected by the magnitude of the piezoelectric coefficient of the elements, changes in the remanent piezoelectric coefficient do not alter the shape of the transfer characteristic but only the magnitude of the filter's voltage gain.

Different structures can be employed in the design of adaptive resonant filters. For example, the piezoferroelectric material can be formed in the shapes of rods or discs. More important, however, is the use of different electrode configurations. The filters can be constructed with a multiple input or multiple output obtained by dividing each of the piezoelectric elements or capacitors into a number of segments. The division can be achieved by segmenting the metal contacts associated with the piezoelectric elements, with or without a dividing channel in the element itself. The segments are each an independent electrically isolated input or output capacitor whose response can be adapted as will be explained hereafter. Moreover, the adaptive resonant filter structure can be modified by substitution of different types of stress sensitive devices for one or more of the input or output capacitors.

Figure 4:
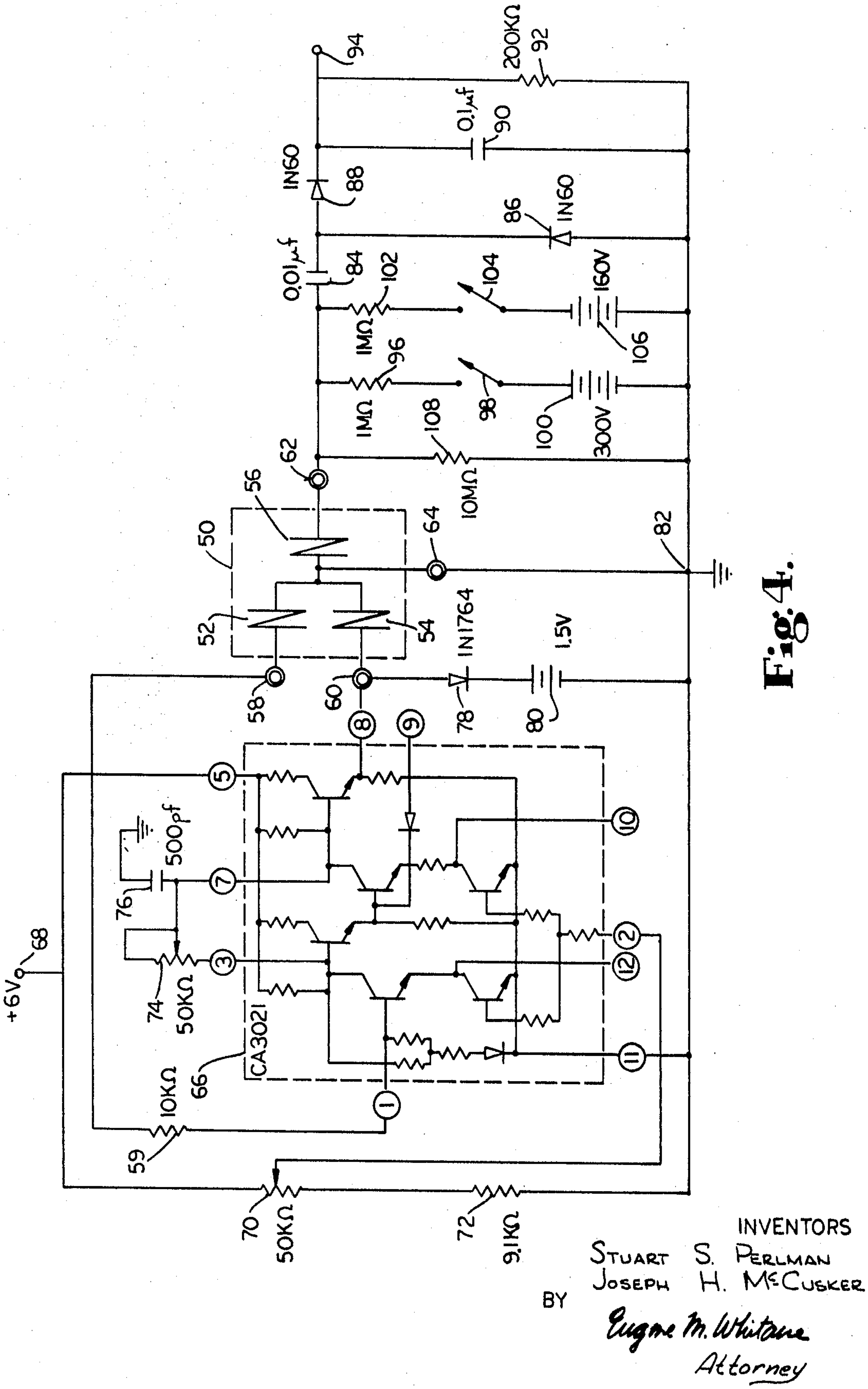
FIG. 4 is a schematic circuit diagram of a control system utilizing a piezoferroelectric adaptive resonant filter having a third terminal connected as a feedback signal or voltage as part of an oscillator circuit.

Reference is now made to FIG. 4 which is a schematic circuit diagram of a control system employing an adaptive resonant filter having an added terminal which supplies a feedback voltage connected as part of an oscillator circuit. An adaptive resonant filter 50 includes a first piezoelectric element 52, a second piezoelectric element 54 and a third piezoelectric element 56. The piezoelectric elements, in addition to having piezoelectric properties, have ferroelectric properties; however, for the particular embodiment shown in FIG. 4, only piezoelectric element 56 need have ferroelectric properties. Each of the piezoelectric elements 52, 54 and 56 provide a capacitance between their respective terminals 58, 60 and 62 and a common terminal 64.

An integrated circuit chip amplifier 66 is interconnected with the piezoelectric elements 52 and 54 to provide self-sustaining oscillations. The integrated circuit amplifier employed is an RCA–CA3021 integrated circuit. The operation of the integrated circuit is not critical to the invention and is disclosed in a publication "RCA Linear Integrated Circuits,"

Technical Series IC–41, on Page 159. This publication can be obtained from the RCA, Electronic Components & Devices Division, Harrison, New Jersey 07029.

The output signal from the integrated circuit amplifier 66 is applied to the terminal 60 and the resultant signal output at the terminal 58 is applied via resistor 59 as a feedback to the input pin connection of the amplifier. Operating potential for the amplifier 66 is obtained from a source of operating potential applied to a terminal 68, and is applied to the integrated circuit at pin connections 5 and by voltage divider resistors 70 and 72 at pin connection 2. A resistor 74 is interconnected between the integrated circuit chip pins 3 and 7 to provide an adjustment of the bandwidth and gain of the amplifier, while the capacitor 76 suppresses high frequency feedback to prevent the oscillator from oscillating in a parasitic mode. A diode 78 and a 1.5 volt battery 80 are connected in series between the terminal 60 and a point of reference potential 82, shown as ground. This limits the input voltage to the filter and helps to stabilize the oscillator by preventing an excessive signal output (feedback) at the terminal 58.

Output signals from the adaptive resonant filter 50 are derived at the terminal 62 and are coupled to a voltage doubler type rectifier and filter circuit which includes a capacitor 84, two diodes 86 and 88, a capacitor 90 and a resistor 92. As a result, a DC voltage output appears at a terminal 94 which is dependent upon the voltage gain of the adaptive resonant filter 50.

A resistor 96, a switch 98 and a battery 100 are connected in series between the filter output terminal 62 and the common terminal 64. When the switch 98 is momentarily closed, a voltage is applied between the terminals 62 and 64 to set the filter gain to a reference level. Similarly, a resistor 102, a switch 104, and a battery 106 are connected in series between the terminals 62 and 64 to provide an adaption or change of the filter voltage gain from the reference level established upon momentary actuation of switch 98. A resistor 108 interconnects the terminal 62 and 64 to provide a discharge path for the voltage impressed upon the capacitance associated with the piezoelectric element 56 and the capacitor 84. The resistor is selected as a compromise of values such that the voltage divider effect of either the resistors 96 and 108 or 102 and 108 present adequate voltage at the terminal 62, while in addition, the discharge time is not so long that the impressed voltage on the capacitance of the piezoelectric element 56 will cause further change due to a continuing reorientation of the ferroelectric domains.

Figure 5:
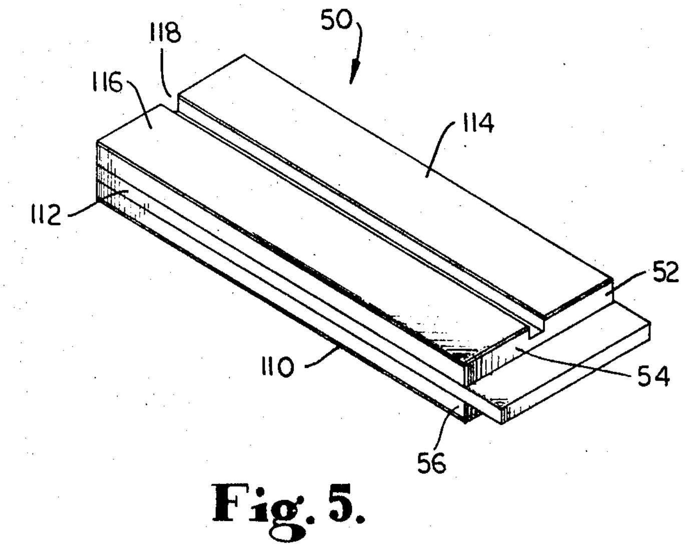
FIG. 5 is a perspective view of the adaptive resonant filter schematically shown in FIG. 4.

Referring now to the filter structure shown in FIG. 5, the structure is a beam sandwich formed of a metal contact 110, a piezoelectric element 56, a conductive brass center vane 112, the piezoelectric elements 52 and 54 with their respective metal contacts 114 and 116. The filter input terminal 60 is connected to the metal contact 116 and the feedback terminal 58 is connected to the metal contact 114. The output terminal 62 is connected to the metal contact 110. The filter 50 can be mounted in a manner similar to that described in conjunction with the adaptive resonant filter 12. The specific dimensions of the adaptive resonant filter 50 are as follows: width 0.15 centimeters; height 0.05 centimeters (including 0.016 centimeter brass center vane); piezoelectric element length 0.38 centimeters; and center vane length 0.4 centimeters. The elements 52, 54 and 56 are a ceramic piezoferroelectric material sold under the trade name PZT–5B by the Clevite Corporation, Bickford, Ohio. The material is of the family of donor doped lead zirconate-lead titanate which is treated in detail, as previously indicated, in the Proceedings of the IRE article.

The metal contact 110 and the center vane 112 form a capacitor with the piezoelectric element 56 serving as the dielectric. Similarly, the metal contact 114 and the metal contact 116 each form a capacitor with their respective piezoelectric elements 52 and 54 serving as the dielectric. It should be noted that all three of the capacitors are electrically isolated; particularly, the capacitors associated with the metal contacts 116 and 114. This is so because the separation or gap 118 between the metal contacts is large enough to make the interelectrode capacitance small and to provide sufficient electric isolation between the metal contacts 116 and 114. To maintain sufficient electrical isolation, it is not necessary for the piezoelectric elements 52 and 54 to have a channel separating them. Any one of the three capacitors can be selected as the input, output or feedback capacitance, and moreover, any of these capacitances can be adapted by the application of a polarization voltage to adapt or change the remanent polarization in the particular dielectric material involved. The capacitors can be divided into more segments if desired to obtain more outputs.

The particular configuration shown in FIG. 4 is arranged so that the oscillator energizes the filter at its resonant or natural frequency. Again, the natural frequency is determined by the piezoferroelectric material utilized, the filter geometry, the type of mount, and the particular mode of mechanical vibration. The application of an alternating voltage at the terminal 60 establishes an alternating stress in the piezoelectric element 54 which is mechanically coupled to the piezoelectric element 52 and through the center vane 112 to the piezoelectric element 56. The alternating mechanical stresses in the piezoelectric elements 52 and 56 cause a voltage to develop between the center vane 112 and the metal contacts 110 and 114. The voltage appearing at the metal contact 114 and hence the terminal 58, is employed as a feedback voltage to sustain oscillations. The voltage developed at the metal contact 110 is rectified to provide a DC output voltage at the terminal 94. This DC voltage can be used to control electronic apparatus, for example, by changing the bias voltage on various electrical components in the apparatus.

By momentarily closing the switch 98, a reset voltage is applied across the terminals 62 and 64 which establishes a voltage gain reference level determined by the orientation of the ferroelectric domains in the piezoferroelectric element 56. To adapt or change the filter voltage gain, the piezoelectric effect is altered in a manner similar to that described in conjunction with FIG. 1. The switch 104 can be momentarily closed to apply an opposite polarity lower magnitude voltage than the reset voltage across the terminals 62 and 64. For the particular filter structure shown in FIG. 5 and the switching voltages shown in FIG. 4, the reset to a reference level is achieved in approximately $10^{13}$ seconds after closing switch 98. Adaption of the voltage gain of the adaptive resonant filter 50 from its maximum value to its minimum or near zero value take approximately 20 seconds after switch 104 is closed. Of course, the switch 104 and battery 106 can be replaced by a remotely controlled pulse generator, as is also the case with switch 98 and battery 100. A much faster or slower adapting or change time can be achieved by using a higher or lower voltage across the terminals 62 and 64.

Figure 6:
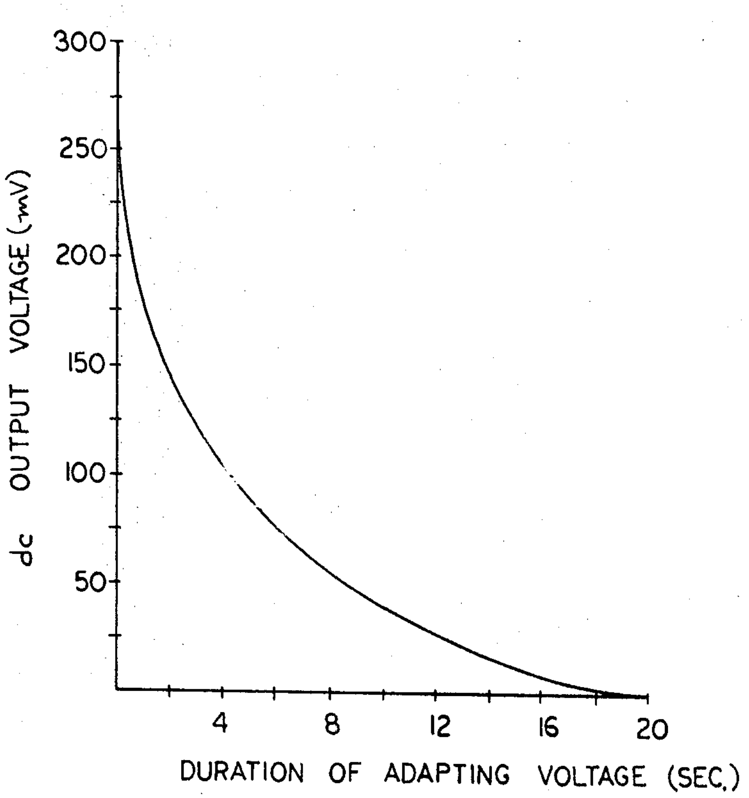
FIG. 6 is a graph of the DC output voltage of the control system shown in FIG. 4 as a function of the duration of the adapting voltage applied to the filter.

Reference is now made to FIG. 6 which is a graph of the DC output voltage appearing at the terminal 94 as a function of the duration of the adapting voltage applied to the adaptive resonant filter 50 by closing the switch 104. At zero time, the filter is in its reference level condition which is achieved by momentarily actuating the switch 98. As can be seen, during the reference condition, an output voltage of 260 millivolts is present and upon actuating of the switch 104 and DC voltage decreases down to a minimum value in approximately 20 seconds. The adapting voltage pulse can be shaped to offset the nonlinearity of the change in DC output voltage as a function of time.

We claim:

1. An electrical circuit comprising: a member having piezoelectric properties and having first and second terminals, said first terminal being adapted to be coupled to a source of electrical signals, and control means coupled to one of said first and said second terminals for selectively applying, upon actuation, a first potential of a predetermined magnitude or a second potential of a different predetermined magnitude to change the piezoelectric properties of said member to control the signal level output from said second terminal when said first terminal is coupled to said source of electrical signals, said first potential changing said piezoelectric properties of said member to increase said signal level output from said second terminal and said second potential changing said piezoelectric properties of said member to decrease said signal level output from said second terminal.

2. An electrical circuit as defined in claim 1 wherein said member includes a first and a second piezoelectric element mechanically coupled together, said first piezoelectric element is electrically connected to said first terminal, and said second piezoelectric element is electrically connected to said second terminal.

3. An electrical circuit as defined in claim 2 wherein at least one of said first and said second piezoelectric elements has ferroelectric properties.

4. An electrical circuit as defined in claim 1 wherein said member includes a first, a second and a third piezoelectric element mechanically coupled together, and a third terminal, said first piezoelectric element is electrically connected to said first terminal, said second piezoelectric element is electrically connected to said second terminal, and said third piezoelectric element is electrically connected to said third terminal.

5. An electrical circuit as defined in claim 4 wherein at least one of said first, said second and said third piezoelectric elements has ferroelectric properties.

6. An electrical circuit as defined in claim 4 wherein circuit means interconnect said first and said third terminals which in conjunction with said first and said third piezoelectric elements form an electrical signal oscillator.

7. An electrical circuit as defined in claim 4 including a signal utilization circuit means coupled to said second terminal for rectifying said signal output from said second terminal.

8. An electrical circuit as defined in claim 1 wherein application of said first potential to said member sets the piezoelectric properties of said member to a reference level to set the signal level output from said second terminal to a predetermined level, and application of said second potential to said member alters the piezoelectric properties of said member from said reference level to alter the signal level output from said predetermined level.

9. An electric circuit as defined in claim 1 including a signal utilization circuit means coupled to said second terminal for rectifying said signal output from said second terminal.

10. An electric circuit as defined in claim 9, wherein said utilization circuit means includes electronic apparatus having at least one function controlled by the rectified signal output from said second terminal.

11. An electrical circuit comprising: a member having piezoelectric properties and having first and second terminals, said first terminal being adapted to be coupled to a source of electrical signals, control means coupled to one of said first and said second terminals for selectively changing the piezoelectric properties of said member to control the signal level output from said second terminal when said first terminal is coupled to said source of electrical signals, and a signal utilization circuit means coupled to said second terminal for rectifying the signal output from said second terminal.

12. An electric circuit as defined in claim 11 wherein said signal utilization circuit means includes electronic apparatus having at least one function controlled by the rectified signal output from said second terminal, said second terminals for selectively applying, upon actuation, a first potential of a predetermined magnitude or a second potential of a different predetermined magnitude to change the piezoelectric properties of said member to control the voltage level developed between said first and second terminals, said first potential changing said piezoelectric properties of said member to increase said voltage level developed between said terminals and said second potential changing said piezoelectric properties of said member to decrease said voltage level developed between said terminals.

13. An electrical circuit comprising: a member having piezoelectric properties and including a first and a second piezoelectric element mechanically coupled together, a first terminal adapted to be coupled to a source of electrical signals and electrically connected to said first piezoelectric element, and a second terminal electrically connected to said second piezoelectric element, control means coupled to one of said first and said second terminals for selectively changing the piezoelectric properties of said member to control the signal level output from said second terminal when said first terminal is coupled to said source of electrical signals, and said control means including a first voltage means for setting the piezoelectric properties of said member to a reference level to set the signal level output from said second terminal to a predetermined level, and a second voltage means for altering the piezoelectric properties of said member from said reference level to alter the signal level output from said predetermined level.

14. An electrical circuit comprising: a member having piezoelectric properties and including a first, a second and a third piezoelectric element mechanically coupled together, a first terminal adapted to be coupled to a source of electrical signals and electrically connected to said first piezoelectric element, a second terminal electrically connected to said second piezoelectric element and a third terminal electrically connected to said third piezoelectric element, control means coupled to one of said first and said second terminals and adapted, upon actuation, to selectively change the piezoelectric properties of said member to control the signal level output from said second terminal when said first terminal is coupled to said source of electrical signals, and said control means including a first voltage means for setting the piezoelectric properties of said member to a reference level to set the signal level output from said second terminal to a predetermined level, and a second voltage means for altering the piezoelectric properties of said member from said reference level to alter the signal level output from said predetermined level.

15. An electric circuit comprising: a member having piezoelectric properties and having a first and a second terminal, means coupled to said member for establishing alternating stresses in said member to cause a voltage to develop between said first and said second terminals, and control means coupled to one of said first and said second terminals for selectively applying, upon actuation, a first potential of a predetermined magnitude or a second potential of a different predetermined magnitude to change the piezoelectric properties of said member to control the voltage level developed between said first and second terminals, said first potential changing said piezoelectric properties of said member to increase said voltage level developed between said terminals and said second potential changing said piezoelectric properties of said member to decrease said voltage level developed between said terminals.

16. An electric circuit as defined in claim 15 wherein said member has ferroelectric properties.

17. An electric circuit as defined in claim 16 wherein one of said first and second potentials is a voltage pulse.

UNITED STATES PATENT OFFICE
CERTIFICATE OF CORRECTION

Patent No. 3,588,551 Dated June 28, 1971

Inventor(s) Stuart S. Perlman & Joseph H. McCusker

It is certified that error appears in the above-identified patent and that said Letters Patent are hereby corrected as shown below:

In Column 3, line 3, "$-P_S \quad P_R \quad +P_S)$" should read -- $-P_S \leq P_R \leq +P_S)$ --; line 71, delete "$10^1 4$" and substitute -- $10^{-4}$ --. Column 6, line 45, delete "$10^{13}$" and substitute -- $10^{-3}$ --. Column 7, line 62, cancel beginning with ", said second terminals for" to and including "between said terminals" in Column 8, line 7.

Signed and sealed this 28th day of December 1971.

(SEAL)
Attest:

EDWARD M.FLETCHER,JR.
Attesting Officer

ROBERT GOTTSCHALK
Acting Commissioner of Patents

FORM PO-1050 (10-69)

USCOMM-DC 60376-P69
☆ U.S. GOVERNMENT PRINTING OFFICE : 1969 O—366-334